United States Patent
Jeong et al.

(10) Patent No.: US 8,120,164 B2
(45) Date of Patent: Feb. 21, 2012

(54) SEMICONDUCTOR CHIP PACKAGE, PRINTED CIRCUIT BOARD ASSEMBLY INCLUDING THE SAME AND MANUFACTURING METHODS THEREOF

(75) Inventors: Eun-woo Jeong, Seoul (KR); Yong-gwang Won, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 540 days.

(21) Appl. No.: 11/948,293

(22) Filed: Nov. 30, 2007

(65) Prior Publication Data

US 2008/0128889 A1   Jun. 5, 2008

(30) Foreign Application Priority Data

Dec. 1, 2006   (KR) .................. 10-2006-0120478

(51) Int. Cl.
*H01L 23/52*   (2006.01)
(52) U.S. Cl. ........ 257/692; 257/678; 257/690; 257/691; 257/E23.101; 257/E21.532
(58) Field of Classification Search .................. 257/691, 257/692
See application file for complete search history.

(56) References Cited

U.S. PATENT DOCUMENTS

| | | | | |
|---|---|---|---|---|
| 4,490,902 | A * | 1/1985 | Eytcheson et al. ............... | 29/827 |
| 5,165,067 | A * | 11/1992 | Wakefield et al. ............ | 257/786 |
| 5,307,237 | A * | 4/1994 | Walz ................. | 361/718 |
| 5,331,305 | A * | 7/1994 | Kanbara et al. .............. | 338/322 |
| 5,367,196 | A * | 11/1994 | Mahulikar et al. ............ | 257/787 |
| 5,691,570 | A * | 11/1997 | Kozuka ................... | 257/693 |
| 5,840,599 | A * | 11/1998 | Lamson et al. ............... | 438/123 |
| 5,847,449 | A * | 12/1998 | Takata et al. ................. | 257/691 |
| 6,226,183 | B1 * | 5/2001 | Weber et al. ................ | 361/704 |
| 6,282,094 | B1 * | 8/2001 | Lo et al. ................. | 361/704 |
| 6,455,348 | B1 * | 9/2002 | Yamaguchi ................... | 438/106 |
| 6,472,251 | B1 * | 10/2002 | Myer et al. ................ | 438/123 |
| 6,525,942 | B2 * | 2/2003 | Huang et al. .................. | 361/704 |
| 6,602,735 | B2 * | 8/2003 | Shyu ............................ | 438/111 |
| 6,794,745 | B1 * | 9/2004 | Lee ............... | 257/692 |
| 6,946,891 | B2 * | 9/2005 | Asano et al. .................. | 327/318 |
| 6,960,824 | B1 * | 11/2005 | Hashemi et al. .............. | 257/698 |
| 7,307,341 | B2 * | 12/2007 | Humbert et al. .............. | 257/728 |
| 7,332,804 | B2 * | 2/2008 | Miyake et al. ................. | 257/692 |
| 7,432,580 | B2 * | 10/2008 | Sato et al. .................... | 257/516 |
| 7,532,479 | B2 * | 5/2009 | Ohno et al. ................. | 361/719 |
| 7,576,429 | B2 * | 8/2009 | Madrid et al. ................ | 257/718 |
| 2001/0052786 | A1 * | 12/2001 | Eldridge et al. ............... | 324/765 |
| 2002/0034066 | A1 * | 3/2002 | Huang et al. ................. | 361/704 |
| 2002/0158331 | A1 * | 10/2002 | Umehara et al. .............. | 257/712 |
| 2003/0052420 | A1 * | 3/2003 | Suzuki et al. ................. | 257/787 |
| 2004/0125578 | A1 * | 7/2004 | Konishi et al. ................ | 361/783 |
| 2004/0253767 | A1 * | 12/2004 | Nurminen .................... | 438/125 |
| 2005/0236706 | A1 * | 10/2005 | Ochiai et al. ................. | 257/692 |

* cited by examiner

*Primary Examiner* — Victor A Mandala
*Assistant Examiner* — William Harriston
(74) *Attorney, Agent, or Firm* — Cantor Colburn LLP

(57) ABSTRACT

A semiconductor chip package and printed circuit board assembly including the same which have a variable mounting orientation include a semiconductor chip disposed on a first surface of an insulating substrate, connectors symmetrically disposed at respective first and opposite second sides of the insulating substrate, a plurality of input/output connecting leads and power connecting leads electrically connected by connecting members to a plurality of internal circuits of the semiconductor chip, at least two internal circuits of the plurality of internal circuits being substantially similar circuits, and a radiating pad disposed on a second opposite surface of the insulating substrate and which is electrically connected to the semiconductor chip.

15 Claims, 6 Drawing Sheets

SEMICONDUCTOR CHIP PACKAGE, PRINTED CIRCUIT BOARD ASSEMBLY INCLUDING THE SAME AND MANUFACTURING METHODS THEREOF

This application claims priority to Korean Patent Application No. 10-2006-0120478, filed on Dec. 1, 2006, and all the benefits accruing therefrom under 35 U.S.C. §119, the contents of which in its entirety are herein incorporated by reference.

BACKGROUND OF THE INVENTION

1. Field of the Invention

The present invention relates to a semiconductor chip package and printed circuit board assembly including the same, and more particularly, to a semiconductor chip package which is flexible in mounting direction and a printed circuit board assembly including the same.

2. Description of the Related Art

Semiconductor chip packages are often used in electronic equipment. A semiconductor chip package generally includes a semiconductor chip with an internal circuit and a plurality of connecting leads connected to the internal circuit. The connecting leads are mounted on an external component such as a printed circuit board, for example. The semiconductor chip package transmits predetermined signals to the internal circuit through the connecting leads mounted on the printed circuit board.

The semiconductor chip package is mounted in a predetermined direction on the printed circuit board. For example, the connecting leads of the semiconductor chip package may be mounted on the printed circuit board in accordance with a predetermined convention such as a pin-map for the semiconductor chip package, for example. To ensure that the semiconductor chip package is positioned correctly, a specific indicator such as a first connecting lead, for example, is provided.

However, the semiconductor chip package may still be positioned incorrectly on the printed circuit board by operator mistake, for example, causing the semiconductor chip package to malfunction and damaging the internal circuit inside the semiconductor chip package.

BRIEF SUMMARY OF THE INVENTION

An exemplary embodiment of the present invention includes a semiconductor chip package which functions properly regardless of a mounting orientation, and a printed circuit board assembly having the same.

Exemplary embodiments of the present invention are not limited to those described herein, and other exemplary embodiments of the present invention will be apparent to those skilled in the art through the following description.

According to an exemplary embodiment of the present invention, a semiconductor chip package includes an insulating substrate having a first surface and an opposite second surface, the insulating substrate defined by a first side and an opposite second side, a plurality of connectors symmetrically disposed on the respective first and second sides of the insulating substrate and a semiconductor chip disposed on the first surface of the insulating substrate.

The semiconductor chip includes a plurality of internal circuits, and at least two internal circuits of the plurality of internal circuits are substantially equivalent circuits and are electrically connected to at least two connectors of the plurality of connectors on the first and second sides. Further, the at least two connectors of the plurality of connectors are symmetrically diagonally disposed with respect to a geometric center of the insulating substrate.

The semiconductor chip package according to an exemplary embodiment of the present invention further includes a plurality of connecting members which electrically connect the plurality of internal circuits of the semiconductor chip to the plurality of connectors of the insulating substrate and a radiating pad disposed on the second surface of the insulating substrate and is electrically connected to at least two individual internal circuits of the plurality of internal circuits of the semiconductor chip.

The plurality of connecting members includes a plurality of bonding wires.

The plurality of connectors includes a plurality of input/output connecting leads and a plurality of power connecting leads.

Two power connecting leads of the plurality of power connecting leads are disposed at the geometric center on the respective first and second sides of the insulating substrate.

At least two power connecting leads of the plurality of power connecting leads are supplied with voltages of substantially the same magnitude.

At least one first via hole is formed in the insulating substrate and a first conductive substance is disposed within the at least one first via hole.

The radiating pad is electrically connected by the first conductive substance to at least one first via hole and the at least one first via hole is electrically connected to at least one internal circuit of the plurality of internal circuits of the semiconductor chip by an individual bonding wire of the plurality of bonding wires which is connected to the first conductive substance disposed within the at least one first via hole.

In an alternative exemplary embodiment, the radiating pad is electrically connected to the first conductive substance disposed within the at least one first via hole and the at least one first via hole is electrically connected to at least one second via hole which contains a second conductive substance and is formed in the semiconductor chip. The second via hole is electrically connected to at least one internal circuit of the plurality of internal circuits of the semiconductor chip by the second conductive substance.

The plurality of internal circuits of the semiconductor chip include a plurality of substantially similar driving circuits which receive driving signals from an outside circuit via the plurality of input/output connecting leads, at least two first power circuits connected to the plurality of power connecting leads and which transmit a first power voltage from an outside circuit to the plurality of substantially similar driving circuits and at least two second power circuits connected to the radiating pad and which transmit a second power voltage from an outside circuit to the plurality of substantially similar driving circuits.

The plurality of substantially similar driving circuits includes an operational amplifier, a buffer and an inverter.

The second power voltage is an earth ground voltage.

According to another exemplary embodiment of the present invention, a printed circuit board assembly having a semiconductor chip package includes a printed circuit board including a plurality of wires and a plurality of connecting pads connected to the wires and a semiconductor chip package mounted on the connecting pads and which receives signals through the wires.

The semiconductor chip package includes an insulating substrate having a first surface and an opposite second surface, the insulating substrate defined by a first side and an opposite second side, a plurality of connectors symmetrically disposed on the respective first and second sides of the insulating substrate and a semiconductor chip disposed on the first surface of the insulating substrate.

The semiconductor chip includes a plurality of internal circuits, and at least two internal circuits of the plurality of internal circuits are substantially equivalent circuits and are electrically connected to at least two connectors of the plurality of connectors on the first and second sides. Further, the at least two connectors of the plurality of connectors are symmetrically diagonally disposed with respect to a geometric center of the insulating substrate.

The semiconductor chip package according to an exemplary embodiment of the present invention further includes a plurality of connecting members which electrically connect the plurality of internal circuits of the semiconductor chip to the plurality of connectors of the insulating substrate and a radiating pad disposed on the second surface of the insulating substrate and is electrically connected to at least two individual internal circuits of the plurality of internal circuits of the semiconductor chip.

The plurality of connecting members includes a plurality of bonding wires.

The plurality of connectors includes a plurality of input/output connecting leads and a plurality of power connecting leads.

Two power connecting leads of the plurality of power connecting leads are disposed at the geometric center on the respective first and second sides of the insulating substrate.

At least two power connecting leads of the plurality of power connecting leads are supplied with voltages of substantially the same magnitude.

At least one first via hole is formed in the insulating substrate and a first conductive substance is disposed within the at least one first via hole.

The radiating pad is electrically connected by the first conductive substance to at least one first via hole and the at least one first via hole is electrically connected to at least one internal circuit of the plurality of internal circuits of the semiconductor chip by an individual bonding wire of the plurality of bonding wires which is connected to the first conductive substance disposed within the at least one first via hole.

In an alternative exemplary embodiment, the radiating pad is electrically connected to the first conductive substance disposed within the at least one first via hole and the at least one first via hole is electrically connected to at least one second via hole which contains a second conductive substance and is formed in the semiconductor chip. The second via hole is electrically connected to at least one internal circuit of the plurality of internal circuits of the semiconductor chip by the second conductive substance.

The plurality of internal circuits of the semiconductor chip include a plurality of substantially similar driving circuits which receive driving signals from an outside circuit via the plurality of input/output connecting leads, at least two first power circuits connected to the plurality of power connecting leads and which transmit a first power voltage from an outside circuit to the plurality of substantially similar driving circuits and at least two second power circuits connected to the radiating pad and which transmit a second power voltage that is earth voltage from an outside circuit to the plurality of substantially similar driving circuits.

The plurality of substantially similar driving circuits includes an operational amplifier, a buffer and an inverter.

Yet another alternative exemplary embodiment of the present invention provides a method of manufacturing a semiconductor chip. The method includes forming an insulating substrate having a first surface and an opposite second surface, the insulating substrate being defined by a first side and an opposite second side, forming a plurality of connectors symmetrically disposed on the respective first and second sides of the insulating substrate and forming a semiconductor chip disposed on the first surface of the insulating substrate. The semiconductor chip includes a plurality of internal circuits and at least two internal circuits of the plurality of internal circuits are substantially equivalent circuit. The at least two internal circuits of the plurality of internal circuits are then electrically connected to at least two connectors of the plurality of connectors on the first and second sides, the at least two connectors of the plurality of connectors being symmetrically diagonally disposed with respect to a geometric center of the insulating substrate. Then, a plurality of connecting members is formed to electrically connect the plurality of internal circuits of the semiconductor chip to the plurality of connectors of the insulating substrate. A radiating pad disposed on the second surface of the insulating substrate is formed and is electrically connected to at least two individual internal circuits of the plurality of internal circuits of the semiconductor chip.

Another alternative exemplary embodiment of the present invention provides a method of manufacturing a printed circuit board assembly having a semiconductor chip. The method includes forming a printed circuit board including a plurality of wires and a plurality of connecting pads connected to the plurality of wires. The method further includes forming an insulating substrate having a first surface and an opposite second surface, the insulating substrate being defined by a first side and an opposite second side, forming a plurality of connectors symmetrically disposed on the respective first and second sides of the insulating substrate and forming a semiconductor chip disposed on the first surface of the insulating substrate. The semiconductor chip includes a plurality of internal circuits and at least two internal circuits of the plurality of internal circuits are substantially equivalent circuit. The at least two internal circuits of the plurality of internal circuits are then electrically connected to at least two connectors of the plurality of connectors on the first and second sides, the at least two connectors of the plurality of connectors being symmetrically diagonally disposed with respect to a geometric center of the insulating substrate. Then, a plurality of connecting members is formed to electrically connect the plurality of internal circuits of the semiconductor chip to the plurality of connectors of the insulating substrate. A radiating pad disposed on the second surface of the insulating substrate is formed and is electrically connected to at least two individual internal circuits of the plurality of internal circuits of the semiconductor chip.

BRIEF DESCRIPTION OF THE DRAWINGS

The above and other aspects, features and advantages of the present invention will become more apparent by describing in further detail exemplary embodiments thereof with reference to the attached drawings, in which.

DETAILED DESCRIPTION OF THE INVENTION

Figure 1A:
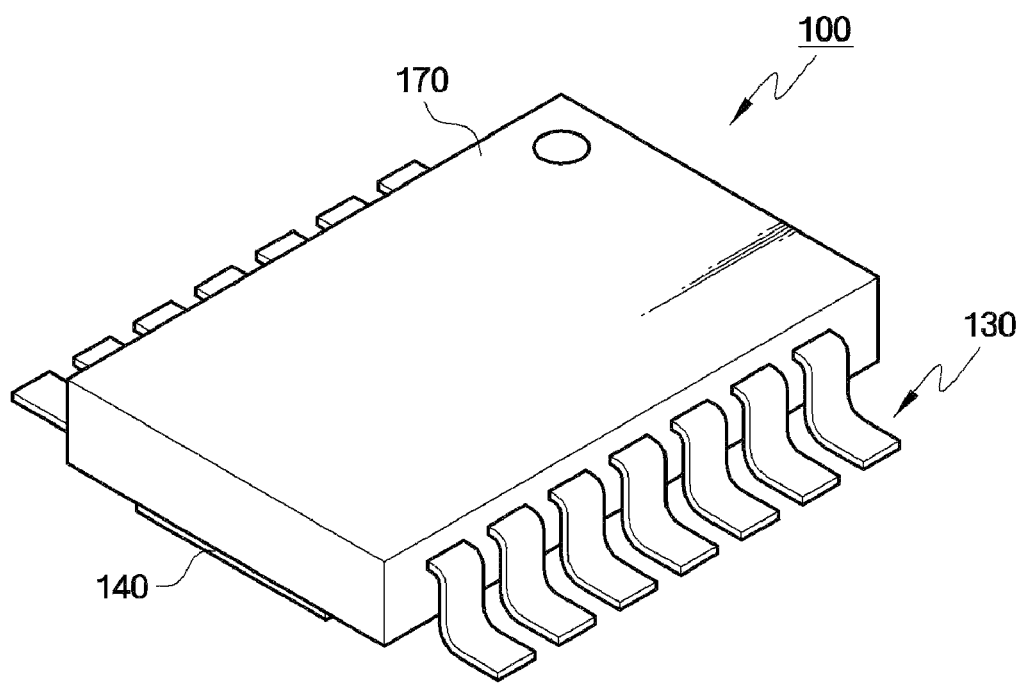
FIG. 1A is a top perspective view of a semiconductor chip package according to an exemplary embodiment of the present invention.

The invention now will be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Exemplary embodiments of the present invention will now be described more fully with reference to the accompanying drawings.

Figure 1B:
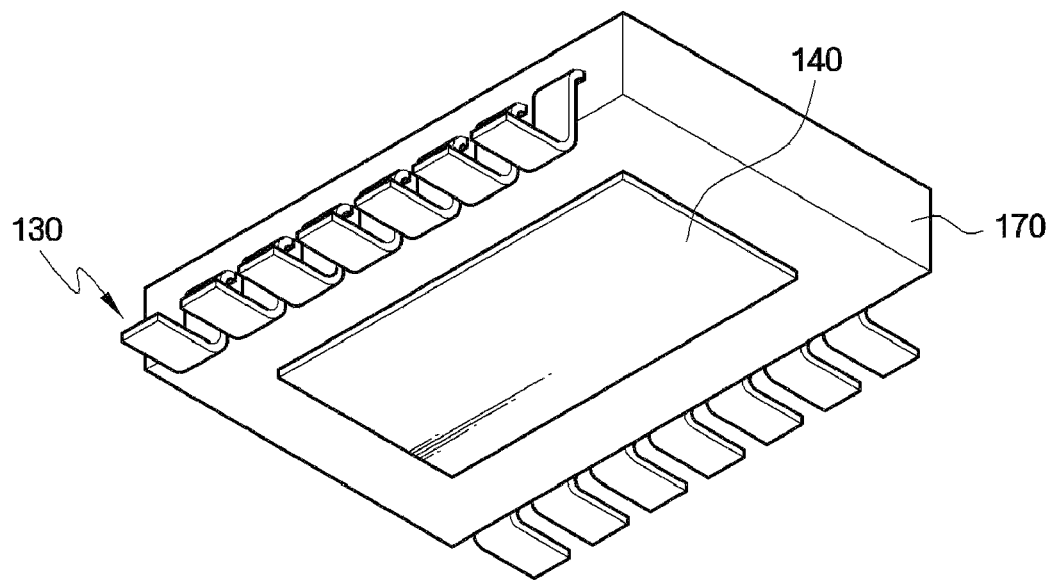
FIG. 1B is a bottom perspective view of the semiconductor chip package according to an exemplary embodiment of the present invention in FIG. 1A.

The configuration of a semiconductor chip package is described schematically with reference to FIGS. 1A and 1B. FIG. 1A is a top perspective view of a semiconductor chip package according to an exemplary embodiment of the present invention and FIG. 1B is a bottom perspective view of the semiconductor chip package according to an exemplary embodiment of the present invention in FIG. 1A.

Referring to FIGS. 1A and 1B, a semiconductor chip package 100 includes a semiconductor chip (not shown) which is mounted on a first surface of an insulating substrate 110 (FIG. 2), contains a plurality of internal circuits (not shown) and is packaged in a resin mold 170 made of an epoxy molding compound ("EMC"), for example, but is not limited thereto.

The semiconductor chip package 100 has a connector 130 which extends from sides of the resin mold 170 and is connected to external components such as a printed circuit board, for example, but is not limited thereto. The connector 130 includes a plurality of first and second connectors 130a and 130b (FIG. 2) which transmit outside signals to the semiconductor chip. Further, the connector 130 may be formed of a metal having good conductivity, such as aluminum or copper, for example, but is not limited thereto.

A radiating pad 140 is disposed on a second opposite surface of the insulating substrate 110. The radiating pad 140 dissipates heat which is generated from the semiconductor chip and is formed of the same material as the connector 130.

Further, the radiating pad 140 is connected to the semiconductor chip and functions as a lead which transmits outside signals to the semiconductor chip. The semiconductor chip package 100 and connections with the outside through the radiating pad 140 will be described later in reference to FIGS. 2 through 6.

Figure 2:
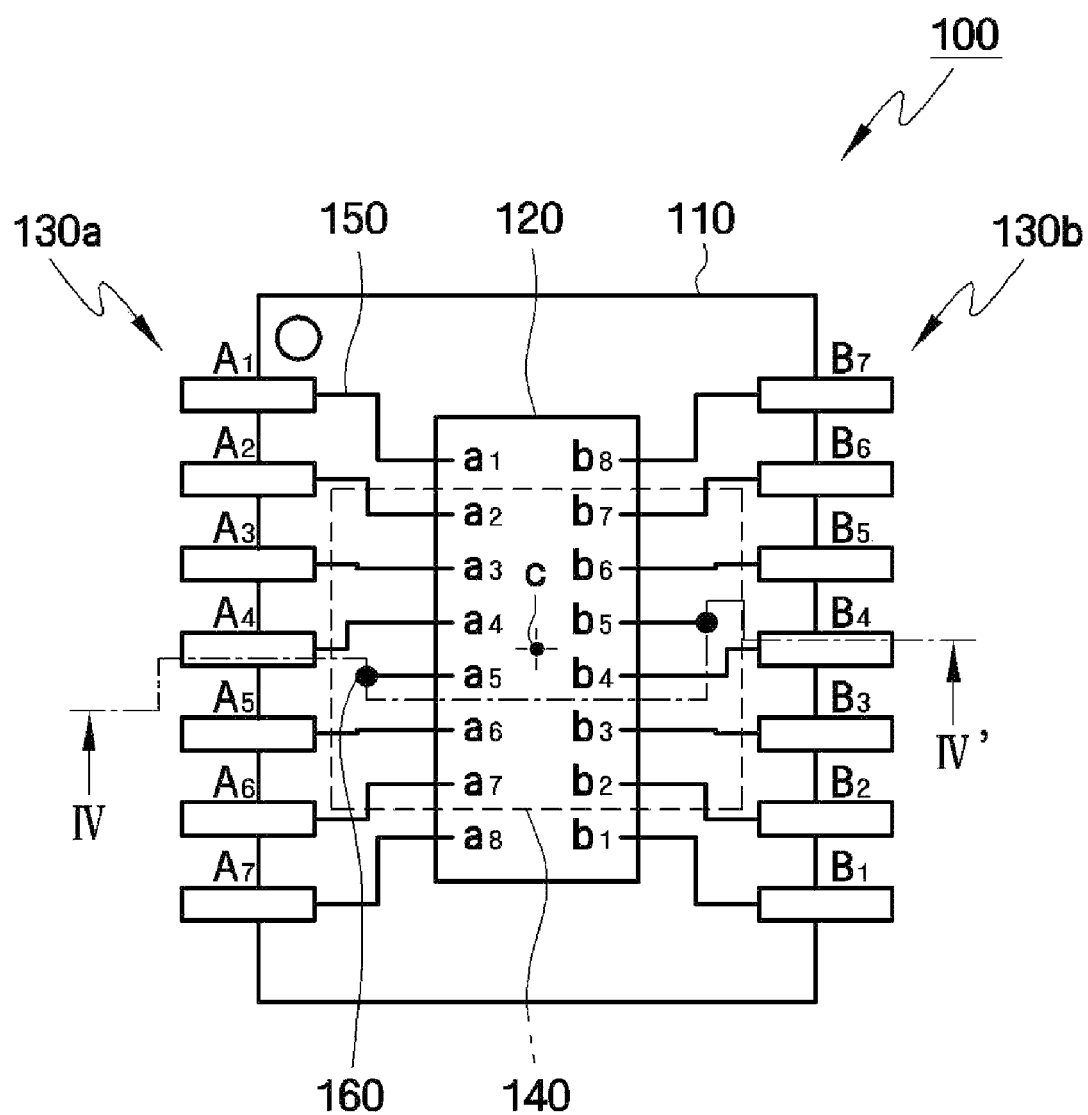
FIG. 2 is a plan view layout of the semiconductor chip package of FIG. 1A according to an exemplary embodiment of the present invention.
Figure 3:
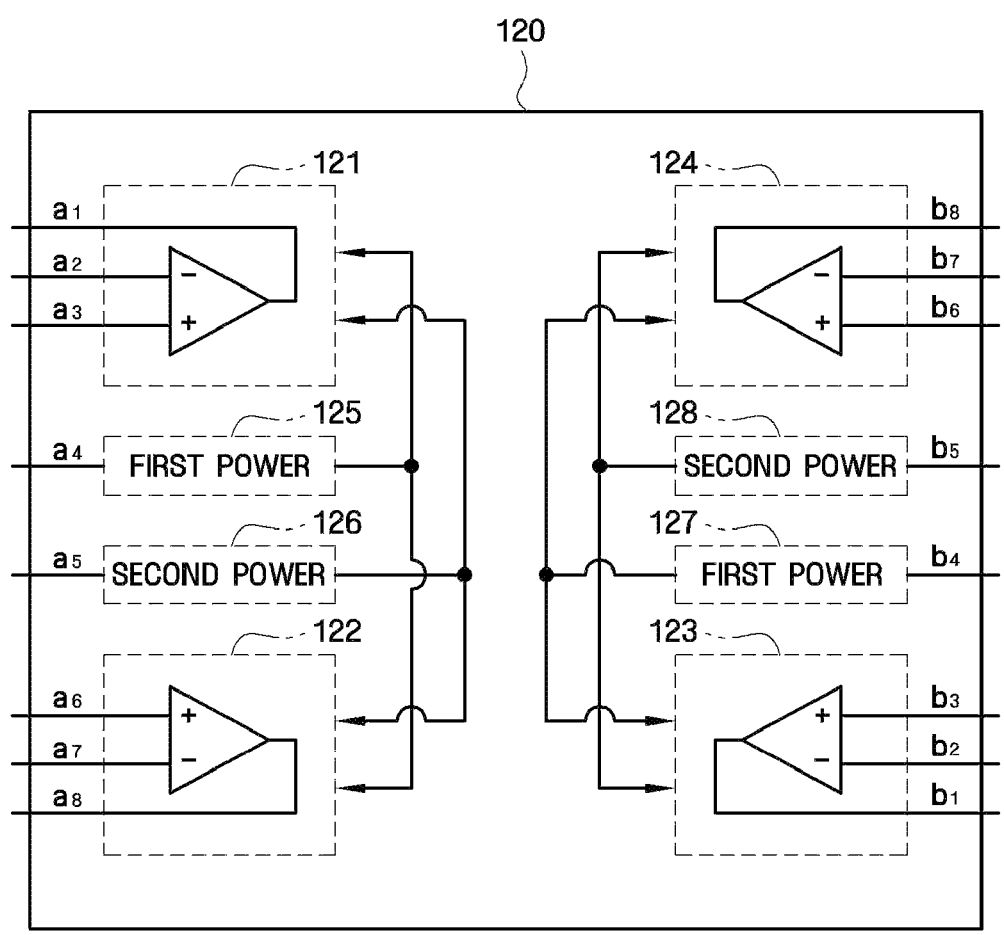
FIG. 3 is an internal circuit diagram of a semiconductor chip of the semiconductor chip package of FIG. 2 according to an exemplary embodiment of the present invention.

A semiconductor chip package according to an exemplary embodiment of the present invention will be described hereinafter in further detail with reference to FIGS. 2 and 3. FIG. 2 is a plan view layout of the semiconductor chip package of FIG. 1A according to an exemplary embodiment of the present invention. FIG. 3 is an internal circuit diagram of the semiconductor chip of the semiconductor chip package of FIG. 2 according to an exemplary embodiment of the present invention. For simplicity in describing exemplary embodiments of the present invention, the semiconductor chip packages, including a semiconductor chip package with a four-channel operational amplifier ("OP-amp"), described herein will have the same outer configuration as the semiconductor chip package shown in FIGS. 1A and 1B. However, it is to be understood that it will be apparent to those having ordinary skill in the art that alternative exemplary embodiments are not limited thereto, and that other electronic circuits may be embodied in the semiconductor chip.

Referring to FIG. 2, the semiconductor chip package 100 according to an exemplary embodiment of the present invention includes the insulating substrate 110, a semiconductor chip 120, the connectors 130a and 130b and the radiating pad 140. The semiconductor chip 120 is disposed on the first surface of the insulating substrate 110 as described above. More specifically, the semiconductor chip 120 is adhered to a preformed seat (not shown) for the semiconductor chip 120 formed on the first surface of the insulating substrate 110. The semiconductor chip 120 is adhered to the insulating substrate 110 by an adhesive member (not shown) which has good thermal conductivity. The insulating substrate 110 may be formed of, for example, but is not limited thereto, an epoxy resin having good insulating characteristics.

The semiconductor chip 120 includes a plurality of input/output ("I/O") terminals a1-a8 and b1-b8 which are connected to an internal circuit (not shown in FIG. 2) of the semiconductor chip 120. The I/O terminals a1-a8 and b1-b8 electrically connect the internal circuit of the semiconductor chip 120 to the first and second connectors 130a and 130b via a plurality of connecting leads A1-A7 and B1-B7 disposed on respective first and second sides of the insulating substrate 110 and the radiating pad 140 as described in further detail below.

Further referring to FIG. 3, the semiconductor chip 120 includes the I/O terminals a1-a8 and b1-b8 and a plurality of circuit components within the internal circuit of the semiconductor chip 120 connected to the I/O terminals. The circuit components may include, for example, but are not limited to first through fourth driving circuits 121, 122, 123 and 124, respectively (hereinafter collectively referred to as "driving circuits"), first power circuits 125 and 127 and second power circuits 126 and 128. The first power circuits 125 and 126 and the second power circuits 127 and 128 of the semiconductor chip 120 are divided into separate components for the sake of illustration, but may be formed in a cell (not shown) inside the semiconductor chip 120 in alternative exemplary embodiments. The driving circuits 121, 122, 123 and 124 may include electronic circuits having the same characteristics, for example, but not being limited thereto, first to fourth driving circuits 121, 122, 123 and 124 which are formed by an OP-amp circuit with four channels.

The driving circuits 121, 122, 123 and 124, and first power circuits 125 and 127 and second power circuits 126 and 128 are connected to the I/O terminals a1-a8 and b1-b8 as illustrated in FIG. 3, and are activated in response to predetermined signals, such as driving voltages and driving signals, respectively, from the outside through the I/O terminals a1-a8 and b1-b8, for example, but are not limited thereto.

More specifically, the first driving circuit 121 is connected to I/O terminals a1-a3, the second driving circuit 122 is connected to I/O terminals a6-a8, the third driving circuit 123 is connected to I/O terminals b1-b3, and the fourth driving circuit 124 is connected to I/O terminals b6-b8 of the semiconductor chip 120 and receive driving signals from the outside. Further, the first power circuits 125 and 127 are connected to the I/O terminals a4 and b4, respectively, of the semiconductor chip 120 and receive first driving voltages from the outside. Similarly, the second power circuits 126 and 128 are connected to the I/O terminals a5 and b5, respectively, of the semiconductor chip 120 and receive second driving voltages from the outside.

The first and second power circuits 125, 126, 127 and 128 are electrically connected to the first to fourth driving circuits 121, 122, 123 and 124 and apply the first and second driving voltages to the first to fourth driving circuits 121, 122, 123 and 124. For example, the first driving voltage supplied from the first power circuits 125 and 127 is applied to the first to fourth driving circuits 121, 122, 123 and 124 to activate the first to fourth driving circuits 121, 122, 123 and 124 and the second driving voltage, which is an earth voltage, e.g., an earth ground, is applied from the second power circuits 126 and 128 to the first to fourth driving circuits 121, 122, 123 and 124, as well.

The I/O terminals a1-a4, a6-a8, b1-b4 and b6-b8 of the semiconductor chip 120 are connected to the first to fourth driving circuits 121, 122, 123 and 124, respectively, and the first power circuits 125 and 127 are electrically connected to the connectors 130a and 130b, respectively. The I/O terminals a5 and b5 are connected to the second power circuits 126 and 128, respectively, and are electrically connected to the radiating pad 140.

Referring again to FIG. 2, to connect the I/O terminals a1-a8 and b1-b8 of the semiconductor chip 120 with the connectors 130a and 130b and/or the radiating pad 140, a bonding wire 150 (FIG. 2) may be used, but the connection is not limited to the bonding wire 150 in alternative exemplary embodiments.

Further referring to FIG. 2, the first and second connectors 130a and 130b having the plurality of connecting leads A1-A7 and B1-B7 are disposed at the respective first and second sides of the insulating substrate 110. More specifically, the first and second connectors 130a and 130b are disposed on opposite sides of the insulating substrate 110 to each other, as illustrated in FIG. 2. Further, the first and second connectors 130a and 130b include a plurality of connecting leads, e.g., the connecting leads A1-A7 and B1-B7, respectively, which are connected to outside components and are electrically connected to the semiconductor chip 120. In an exemplary embodiment of the present invention, the connecting leads A1-A7 and B1-B7 may include a plurality of I/O connecting leads A1-A3, A5-A7, B1-B3, and B5-B7, and power connecting leads A4 and B4, but alternative exemplary embodiments are not limited thereto.

The first and second connectors 130a and 130b transmit signals which are supplied from the outside, for example from a printed circuit board, but is not limited thereto, to the semiconductor chip 120. The I/O connecting leads A1-A3, A5-A7, B1-B3 and B5-B7 of the first and second connectors 130a and 130b transmit driving signals supplied from the example printed circuit board to the semiconductor chip 120. Further, the power connecting leads A4 and B4 of the first and second connectors 130a and 130b, respectively, transmit the first driving voltage applied from the printed circuit board to the semiconductor chip 120.

As discussed above, the I/O connecting leads A1-A3, A5-A7, B1-B3 and B5-B7 of the first and second connectors 130a and 130b are connected to the I/O terminals a1-a3, a6-a8, b1-b3 and b6-b8, respectively, of the first to fourth driving circuits 121, 122, 123 and 124 of the semiconductor chip 120. Accordingly, driving signals from the outside are transmitted to the first to fourth driving circuits 121, 122, 123 and 124.

The power connecting leads A4 and B4 of the first and second connectors 130a and 130b, respectively, are connected to the first power circuits 125 and 127 of the semiconductor chip 120, respectively. Accordingly, the first driving voltage from the outside is applied to the first power circuits 125, 127. The first power voltage applied to the semiconductor chip 120 through the power connecting leads A4 and B4, respectively, is, for example, the driving voltage for the semiconductor chip 120.

The first and second connectors 130a and 130b are connected to the I/O terminals a1-a8 and b1-b8, respectively, by, for example, the bonding wire 150, but are not limited thereto.

More specifically, the I/O connecting leads A1-A3, A5-A7, B1-B3 and B5-B7 of the first and second connectors 130a and 130b are connected to the I/O terminals a1-a3, a6-a8, b1-b3 and b6-b8, respectively, of the first to fourth driving circuits 121, 122, 123 and 124 of the semiconductor chip 120, through the bonding wire 150.

On the other hand, the power connecting leads A4 and B4 of the first and second connectors 130a, 130b, respectively, are connected to the I/O terminals a4 and b4 of the first power circuits 125 and 127, respectively, of the semiconductor chip 120 through the bonding wire 150.

The bonding wire 150 may be formed of a conductive metal, such as gold or copper, for example, but is not limited thereto.

Referring again to FIGS. 2 and 3, the first and second connectors 130a and 130b are disposed on the respective first and second opposite sides of the insulating substrate 110. Each connecting lead A1-A3 and A5-A7, and B1-B3 and B5-B7 of the first and second connectors 130a and 130b, respectively, faces the power connecting leads A4 and B4, respectively, as illustrated in FIG. 2.

More specifically, the connecting leads A1-A3 and A5-A7 of the first connector 130a are connected to the I/O terminals a1-a2 and a6-a8, respectively, of the first and second driving circuits 121 and 122, respectively, of the semiconductor 120. Further, the connecting leads B1-B3 and B5-B7 of the second connector 130b are connected to the I/O terminals b1-b3 and b6-b8, respectively, of the third and fourth driving circuits 123 and 124, respectively, of the semiconductor 120.

As illustrated in FIG. 2, the connecting leads A1-A3 and A5-A7 of the first connector 130a are symmetrically diagonally disposed from a center point C (FIG. 2) of the insulating substrate 110 to the I/O connecting leads B1-B3 and B5-B7, respectively, of the second connector 130b.

More specifically, the connecting leads A1-A3 of the first connector 130a connected to the first driving circuit 121 of the semiconductor chip 120 are symmetrically diagonally disposed with respect to the center point C of the insulating substrate 110 to the connecting leads B1-B3 of the second connector 130b connected to the third driving circuit 123 of the semiconductor chip 120.

Similarly, the connecting leads A5-A7 of the first connector 130a connected to the second driving circuit 122 of the semiconductor chip 120 are symmetrically diagonally disposed with respect to the center point C of the insulating substrate 110 to the connecting leads B5-B7 of the second connector 130b connected to the fourth driving circuit 124 of the semiconductor chip 120.

In exemplary embodiments of the present invention, the semiconductor chip 120, the first and third driving circuits 121 and 123 and/or the second and fourth driving circuits 122 and 124 include electronic circuits having substantially the same characteristics. More specifically, the first driving circuit 121 which is connected to the connecting leads A1-A3 of the first connector 130a is formed in substantially the same configuration as the third driving circuit 123 which is connected to the connecting leads B1-B3 of the second connector 130b which is symmetrically diagonally disposed with respect to the connecting leads A1-A3. Further, the second driving circuit 122 which is connected to the connecting leads A5-A7 of the first connector 130a is formed in substantially the same configuration as the fourth driving circuit 124 which is connected to the connecting leads B5-B7 of the second connector 130b which are symmetrically diagonally disposed with respect to the connecting leads A5-A7.

Therefore, even if the semiconductor chip package 100 is rotated clockwise and/or counterclockwise 180°, the first and second connectors 130a and 130b connected to the first to fourth driving circuits 121, 122, 123 and 124 of the semiconductor chip 120 connect to substantially similar circuits when the semiconductor chip package 100 is mounted by an operator. As a result, if the operator mistakenly positions the semiconductor chip package 100 incorrectly, e.g., rotated 180°, the semiconductor chip package 100 does not malfunction and the circuits inside the semiconductor chip package 100 are not damaged.

The power connecting lead A4 of the first connector 130a and the power connecting lead B4 of the second connector 130b are connected to the I/O terminals a4 and b4, respectively, of the first power circuits 125 and 127, respectively, of the semiconductor chip 120. The power connecting leads A4 and B4 of the first and second connectors 130a and 130b, respectively, are aligned with the center point C on respective sides of the insulating substrate 110 between the connecting leads A1-A3 and A5-A7, and connecting leads B1-B3 and B5-B7, respectively, as illustrated in FIG. 2.

Further, the power connecting lead A4 of the first connector 130a and the power connecting lead B4 of the second connector 130b are symmetrically disposed from the center point C of the insulating substrate 110. The same signals, e.g., the first driving voltage, but not being limited thereto, are applied from the outside to the power connecting leads A4 and B4 of the first and second connectors 130a and 130b, respectively.

More specifically, the power connecting leads A4 and B4 of the first and second connectors 130a and 130b, respectively, as described above, are connected to the first power circuits 125 and 127, respectively, of the semiconductor chip 120 with substantially the same electric potential, e.g., the first driving voltage is applied to both the first and second power circuits 125 and 127. Thus, predetermined signals supplied from the printed circuit board such as the first driving voltage are applied to the first power circuits 125 and 127 of the semiconductor chip 120 through the power connecting leads A4 and B4, respectively, of the first and second connectors 130a and 130b, respectively. In an exemplary embodiment of the present invention, the first driving voltage from the outside is the driving voltage to activate, for example, the first to fourth driving circuits 121, 122, 123 and 124 of the semiconductor chip 120 as described in further detail above.

The power connecting leads A4 and B4 of the first and second connectors 130*a* and 130*b*, respectively, are aligned with the center point C on the insulating substrate 110. Accordingly, even if the semiconductor chip package 100 is turned clockwise and/or counterclockwise 180°, the first and second connectors 130*a* and 130*b* connected to the first power circuits 125 and 127, respectively, of the semiconductor chip 120 provide the same driving voltage to the respective first power circuits 125 and 127. Therefore, as described above, if the semiconductor chip package 100 is positioned incorrectly due to an error by an operator, for example, a malfunction of the semiconductor chip package 100 is effectively prevented because of the symmetry of the first and second connectors 130*a* and 130*b*.

In an exemplary embodiment, the semiconductor chip package 100, in which the power connecting leads A4 and B4 of the connecting leads A1-A7 and B1-B7, respectively, are aligned with the center point C of the insulating substrate 110 point are symmetrically disposed in the middle of the I/O connecting leads. However, the present invention is not limited thereto, and alternative exemplary embodiments may include arrangements wherein the power connecting leads A4 and B4 are disposed at other positions on or at either or both sides of the insulating substrate 110, as long as the positions are symmetric. The other positions may be diagonally symmetrically disposed from the center point C of the insulating substrate 110, for example, but are not limited thereto.

Referring again to FIG. 2, the radiating pad 140 is disposed on the second opposite surface of the insulating substrate 110. The radiating pad 140 is formed in a substantially square or rectangular shape having a predetermined size on the other surface opposite to the semiconductor chip 120 of the insulating substrate 110 and dissipates heat which is generated by the semiconductor chip 120.

Further, the radiating pad 140 is electrically connected to I/O terminals a5 and b5 of the semiconductor chip 120 through at least one first via hole 160 formed in the insulating substrate 110.

Referring to FIGS. 2 and 3, as described above, the semiconductor chip 120 includes the first to fourth driving circuits 121, 122, 123 and 124, the first power circuits 125 and 127 and the second power circuits 126 and 128. As described above, the first to fourth driving circuits 121, 122, 123 and 124 and the first power circuits 125 and 127 of the semiconductor chip 120 are connected to the connectors 130*a* and 130*b* and are supplied with the driving signals and the first driving voltage from the outside.

The second power circuits 126 and 128 of the semiconductor 120 are electrically connected to the radiating pad 140 and are supplied with the second driving voltage from the outside through the radiating pad 140.

The radiating pad 140 is electrically connected to the semiconductor chip 120 through the first via hole 160 in the insulating substrate 110. The I/O terminals a5 and b5 of the second power circuits 126 and 128, respectively, of the semiconductor chip 120 are connected to the first via hole 160 in the insulating substrate 110 through the bonding wire 150, and the first via hole 160 is connected to the radiating pad 140 by a conductive substance within the semiconductor chip package 100. Accordingly, the second driving voltage is applied to the second power circuits 126 and 128 of the semiconductor chip 120 through the radiating pad 140 from the outside. Thus, the second power circuits 126 and 128 of the semiconductor chip 120 are applied to the first to fourth driving circuits 121, 122, 123 and 124. The second power voltage is an earth voltage, e.g., an earth ground, for example, but is not limited thereto.

As described above, the semiconductor chip package 100 according to an exemplary embodiment of the present invention uses the radiating pad 140 as a connecting lead. Accordingly, the semiconductor chip package 100 of the present invention is supplied with the first driving voltage of the semiconductor chip 120 through the connecting leads A4 and B4, respectively, which are symmetrically disposed at the respective first and second sides of the insulating substrate 110 and the second driving voltage of the semiconductor chip 120 through the radiating pad 140 disposed on the bottom of the insulating substrate 100 through bonding wires 150 and the first via holes 160. As a result, even if an operator makes an error in mounting the semiconductor package, malfunction of the semiconductor chip package is effectively prevented.

Figure 4A:
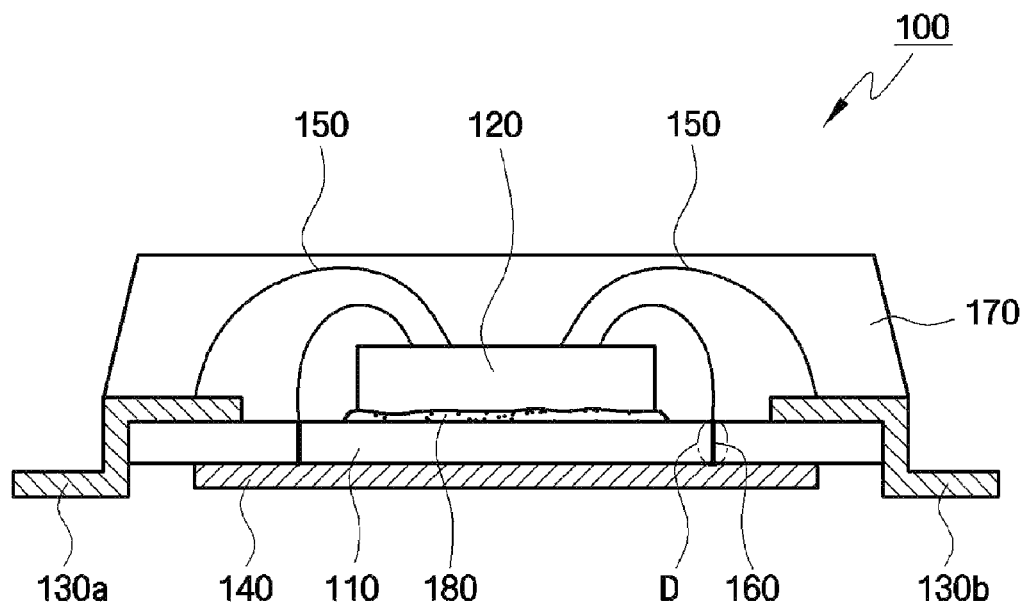
FIG. 4A is a cross-sectional view taken along line IV-IV' of the semiconductor chip package of FIG. 2 according to an exemplary embodiment of the present invention.
Figure 4B:
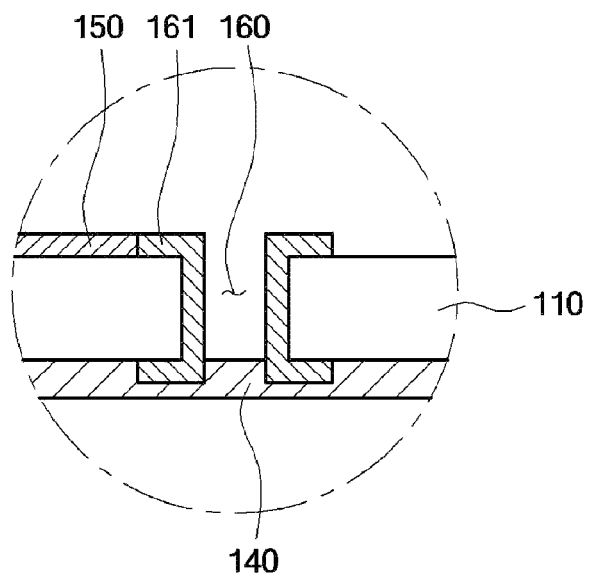
FIG. 4B is an enlarged partial view of part "D" of the semiconductor chip package of FIG. 4A according to an exemplary embodiment of the present invention.

The connecting structure of the radiating pad and the semiconductor chip will be described hereinafter in further detail with reference to FIGS. 4A and 4B. FIG. 4A is a cross-sectional view taken along line IV-IV' of the semiconductor chip package according to an exemplary embodiment of the present invention in FIG. 2, and FIG. 4B is an enlarged partial view of part "D" of the semiconductor chip package according to an exemplary embodiment of the present invention in FIG. 4A. FIGS. 2 and 3 will be referred to together with FIGS. 4A and 4B for the sake of convenience and clarity in describing the present exemplary embodiment.

Referring to FIGS. 4A and 4B, the semiconductor chip package 100 according to the present exemplary embodiment includes the insulating substrate 110, the semiconductor chip 120, the first and second connectors 130*a* and 130*b*, the radiating pad 140, the bonding wire 150, the first via hole 160 and the resin mold 170, as described in reference to FIGS. 1 to 3.

Further, the semiconductor chip 120, as described above, has the first to fourth driving circuits 121, 122, 123 and 124, the first power circuits 125 and 127 and the second power circuits 126 and 128. The semiconductor chip 120 is adhered to the first surface of the insulating substrate 110 by an adhesive member 180 (FIG. 4A) having a high thermal conductivity, as described in greater detail above.

The first and second connectors 130*a* and 130*b* have the connecting leads A1-A7 and B1-B7, respectively, and are symmetrically diagonally disposed with respect to the center point C (FIG. 2) on both sides of the insulating substrate 110. Further, the connectors 130*a* and 130*b* are connected to the semiconductor chip 120 by a respective connecting member 150, for example, the bonding wire 150, but is not limited thereto.

The radiating pad 140 is disposed on the second opposite surface of the insulating substrate 110. The radiating pad 140 dissipates heat which is generated from the semiconductor chip 120. Further, the radiating pad 140 is electrically connected to the semiconductor chip 120 through at least one of the first via holes 160 formed in the insulating substrate 110.

In reference to FIGS. 4A and 4B, the first via hole 160 is formed in the insulating substrate 110 and a conductive substance 161 is provided inside the first via hole 160. Accordingly, the radiating pad 140 is connected to the first via hole 160 with the conductive substance 161.

The semiconductor chip 120 is electrically connected to the first via hole 160 through the bonding wire 150. Therefore, the radiating pad 140 is electrically connected to the semiconductor chip 120 through the first via hole 160 and the bonding wire 150 connected to the conductive substance 161.

Described in further detail with reference to FIGS. 2, 3 and 4A, the radiating pad 140 is electrically connected to the I/O terminals a5 and b5 of the second power circuits 126 and 128, respectively, of the semiconductor chip 120 through the first via hole 160 and the bonding wire 150 and conductive substance 161. Accordingly, the radiating pad 140 transmits signals, for example, but not being limited thereto, the second driving voltage for the semiconductor chip 120, supplied from an outside component, such as a printed circuit board, to the second power circuits 126 and 128 through the first via hole 160 and the bonding wire 150 and conductive substance 161. The second driving voltage is an earth voltage, e.g., an earth ground, for the semiconductor chip 120, for example, but is not limited thereto.

Figure 5A:
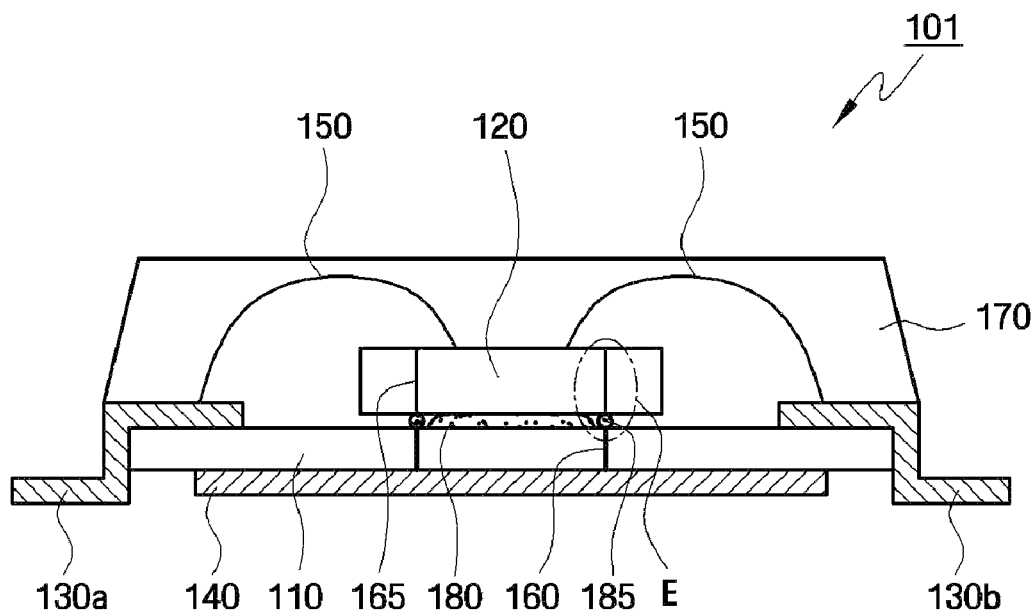
FIG. 5A is a cross-sectional view of a semiconductor chip package according to another exemplary embodiment of the present invention.
Figure 5B:
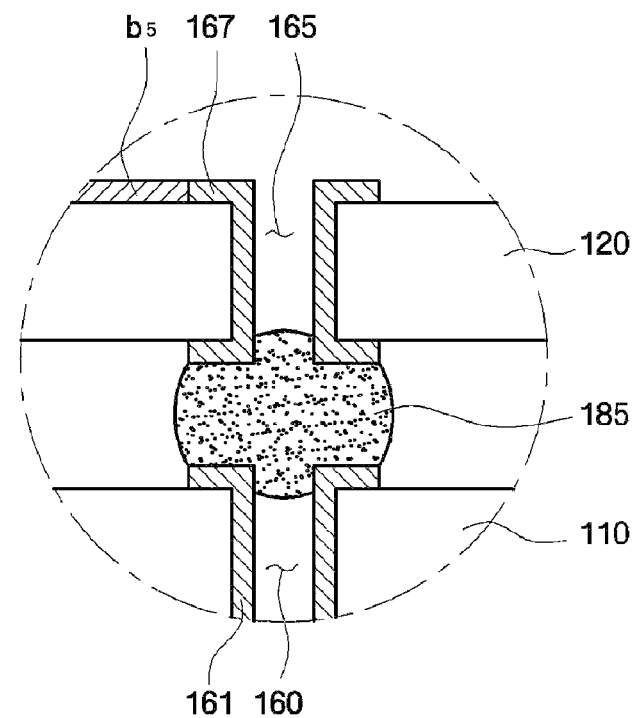
FIG. 5B is an enlarged partial view of part "E" of the semiconductor chip package of FIG. 5A according to an exemplary embodiment of the present invention.

An alternative connection of the radiating pad 140 and the semiconductor chip 120 according to another exemplary embodiment of the present invention will be is described hereinafter in further detail with reference to FIGS. 5A and 5B. FIG. 5A is a cross-sectional view of a semiconductor chip package according to another exemplary embodiment of the present invention and FIG. 5B is an enlarged partial view of part "E" of the semiconductor chip package according to an alternative exemplary embodiment of the present invention in FIG. 5A. Components having the same function as the components shown in FIGS. 4A and 4B are represented by the same reference numerals for the sake of convenience and may not be described again hereinafter. Further, FIGS. 2 and 3 will be referred to again together with FIGS. 5A and 5B.

Referring to FIGS. 5A and 5B, according to a semiconductor chip package 101 of the present alternative exemplary embodiment, the radiating pad 140 is electrically connected to the semiconductor chip 120 through the first via holes 160 formed in the insulating substrate 110 and semiconductor chip via holes 165 formed in the semiconductor chip 120.

More specifically, at least one first via hole 160 is formed in the insulating substrate 110. The first conductive substance 161 is provided inside the first via hole 160 and allows the radiating pad 140 to be connected to the insulating substrate 110.

The semiconductor chip 120 is adhered to the first surface of the insulating substrate 110 by the adhesive member 180 and has at least one second via hole 165. A second conductive substance 167 is provided inside the second via hole 165. The second via hole 165 is connected to the first via hole 160 of the insulating substrate 110. The first and second via holes 160 and 165 are connected by a respective connecting member 185, for example, a solder bump 185, but is not limited thereto Therefore, the radiating pad 140 disposed on the second opposite surface of the insulating substrate 110 is connected to the semiconductor chip 120 through the first via hole 160 and the second via hole 165 which is connected to the first via hole 160 by the solder bump 185.

Referring to FIGS. 2, 3, and 5A, the second via hole 165 in the semiconductor chip 120 is connected to the I/O terminal b5 of the second power 128. Accordingly, the radiating pad 140 transmits signals supplied from the outside, for example, the second driving voltage for the semiconductor chip 120 to the second power 128 of the semiconductor chip 120 through the first via hole 160 and the second via hole 165. The second driving voltage is an earth voltage, e.g., an earth ground, for example, but is not limited thereto.

The resin mold 170 shown in FIGS. 4A and 5A is formed to have a predetermined thickness on the first surface of the insulating substrate 110 on which the semiconductor chip 120 is disposed. The resin mold 170 protects the semiconductor chip 120 and the bonding wire 150 and forms the outer shape of the semiconductor chip packages 100 and 101. The resin mold 170 may be formed of an insulating substance such as an EMC, for example, but is not limited thereto.

Figure 6:
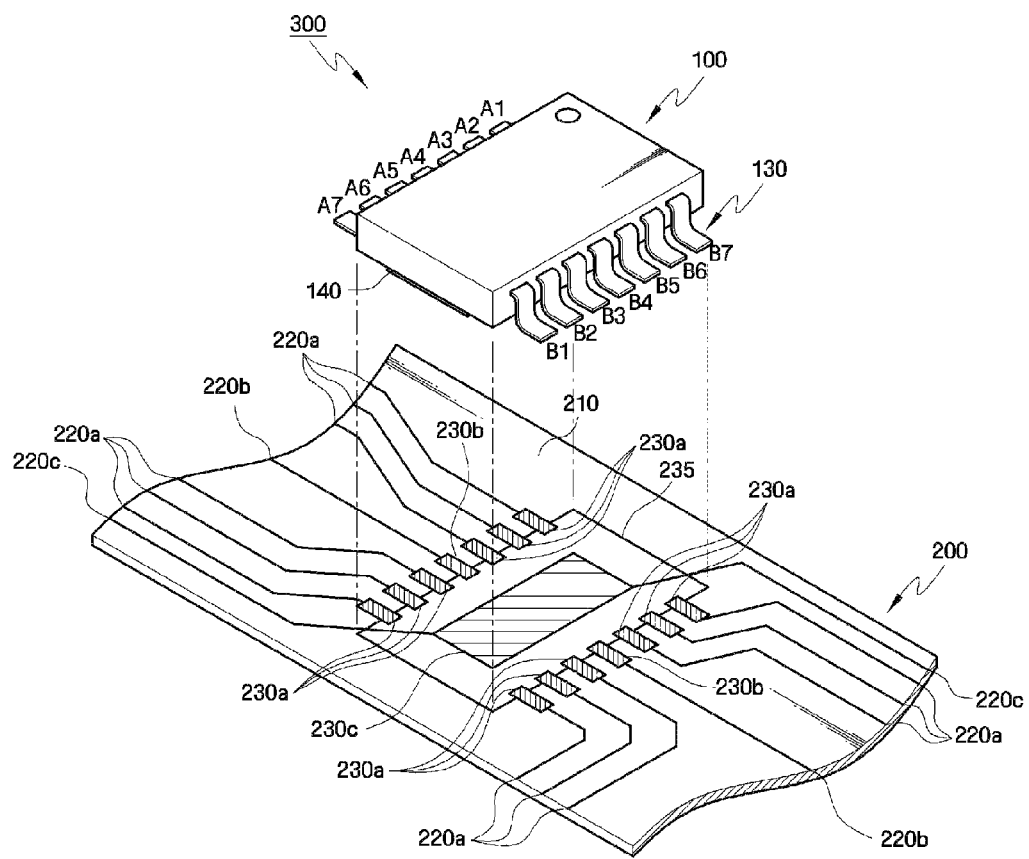
FIG. 6 is an exploded partial perspective view of a printed circuit board assembly according to another exemplary embodiment of the present invention.

A printed circuit board assembly including the semiconductor package will be described in further detail hereinafter with reference to FIG. 6. FIG. 6 is a partial perspective view of a printed circuit board assembly including the semiconductor chip package according to an exemplary embodiment of the present invention. As before, FIGS. 1 through 5B will be referred to together with FIG. 6 for the sake of clarity and convenience.

Referring to FIG. 6, a printed circuit board assembly 300 according to an exemplary embodiment of the present embodiment includes a printed circuit board 200 and a semiconductor chip package 100 which is provided on the printed circuit board 200. The semiconductor chip package 100 includes a connector 130 having a plurality of connecting leads (not shown) and a radiating pad 140 and is substantially the same as a semiconductor chip package according to an exemplary embodiment described above in reference to FIGS. 1 through 5B.

The printed circuit board 200 includes a plurality of driving signal transmitting wires 220a which correspond to and are connected to driving signal transmitting wire connecting pads 230a which correspond to connection leads A1 to A3, A5 to A7, B1 to B3 and B5 to B7, a plurality of first driving voltage transmitting wires 220b which correspond to and are connected to first driving voltage transmitting wire connecting pads 230b which correspond to connecting leads A4 and B4, and a second driving voltage transmitting wire 220c which corresponds to and is connected to a second driving voltage transmitting wire connecting pad 230c which corresponds to the radiating pad 140. Hereinafter, the driving signal transmitting wire connecting pads 230a, the first driving voltage transmitting wire connecting pads 230b and the second driving voltage transmitting wire connecting pad 230c are collectively referred to as "connecting pads 230a, 230b and 230c."

The connecting pads 230a, 230b and 230c of the printed circuit board 200 are composed of first to third connecting pads to mount the connector 130 and the radiating pad 140 of the semiconductor chip package 100 as described above.

Accordingly, the semiconductor chip package 100 mounted on the first to third connecting pads 230a, 230b and 230c of the printed circuit board 200 receives predetermined signals through the wires 220a, 220b and 220c to receive driving voltages and driving signals as described in further detail above in reference to other exemplary embodiments of the present invention.

More specifically, the connecting leads A1-A3, A5-A7, B1-B3 and B5-B7 of the semiconductor chip package 100 which are mounted on the driving signal transmitting wire connecting pads 230a of the printed circuit board 200 receive the driving signals through the driving signal transmitting wires 220a. Further, the power connecting leads A4 and B4 of the semiconductor chip package 100 which are mounted on the first driving voltage transmitting wire connecting pad 230b receive the first driving voltage through the first driving voltage transmitting wire 220b.

The power connecting leads A4 and B4 of the semiconductor chip package 100, as described above, are disposed in the center of the insulating substrate 110.

The first driving voltage transmitting wire 220b of the printed circuit board 200 is connected to the first driving voltage transmitting wire connecting pad 230b and transmits the first driving voltage to the first driving voltage transmitting wire connecting pad 230b. Accordingly, the power connecting leads A4 and B4 of the semiconductor chip package 100 mounted on the first driving voltage transmitting wire connecting pad 230b are supplied with the first driving voltage.

The radiating pad 140 of the semiconductor chip package 100 which is mounted on the second driving voltage transmitting wire connecting pad 230c of the printed circuit board 200 is supplied with the second driving voltage through the second driving voltage transmitting wire 220c. The radiating pad 140, as described above, is connected to the semiconductor chip through the first via hole 160 and the bonding wire 150. Therefore, the second driving voltage is applied to the semiconductor chip through the second driving voltage transmitting wire 220c and the radiating pad 140. The second driving voltage applied to the semiconductor chip package 100 is an earth voltage, e.g., an earth ground, for example, but is not limited thereto.

Solder is applied to mount the semiconductor chip package 100 and the connecting pads 230a, 230b and 230c, e.g., to mount the connector 130 of the semiconductor chip package 100 and the radiating pad 140 onto the connecting pads 230a, 230b and 230c of the printed circuit board 200, but the mounting method is not limited to soldering.

A reference marking 235 denoting, for example, but not being limited thereto, electrode and component names of the semiconductor chip package 100 may be formed on the second insulating substrate 210 by a silk screen printing process or other appropriate method.

In another alternative exemplary embodiment of the present invention, a method of manufacturing a semiconductor chip package is provided. The method includes first forming an insulating substrate which has a first surface and an opposite second surface. The insulating substrate is further defined by a first side and an opposite second side. Next, a plurality of connectors are symmetrically disposed on the respective first and second sides of the insulating substrate, and a semiconductor chip is disposed on the first surface of the insulating substrate. The semiconductor chip includes a plurality of internal circuits and at least two internal circuits of the plurality of internal circuits are substantially equivalent circuits. The at least two internal circuits of the plurality of internal circuits are then connected to at least two connectors of the plurality of connectors on the first and second sides. The at least two connectors of the plurality of connectors are symmetrically diagonally disposed with respect to a geometric center of the insulating substrate. Then a plurality of connecting members are formed, and the plurality of internal circuits of the semiconductor chip to the plurality of connectors of the insulating substrate by the plurality connecting members. A radiating pad is disposed on the second opposite surface of the insulating substrate, and is electrically connected to at least two individual internal circuits of the plurality of internal circuits of the semiconductor chip by the plurality connecting members.

In yet another alternative exemplary embodiment of the present invention, a method of manufacturing a printed circuit board assembly having a semiconductor chip package is provided. The method includes first forming a printed circuit board. The printed circuit board includes a plurality of wires and a plurality of connecting pads connected to the plurality of wires, as described above in reference to other exemplary embodiments of the present invention. Then, an insulating substrate which has a first surface and an opposite second surface is formed. The insulating substrate is further defined by a first side and an opposite second side. Next, a plurality of connectors are symmetrically disposed on the respective first and second sides of the insulating substrate, and a semiconductor chip is disposed on the first surface of the insulating substrate. The semiconductor chip includes a plurality of internal circuits and at least two internal circuits of the plurality of internal circuits are substantially equivalent circuits. The at least two internal circuits of the plurality of internal circuits are then connected to at least two connectors of the plurality of connectors on the first and second sides. The at least two connectors of the plurality of connectors are symmetrically diagonally disposed with respect to a geometric center of the insulating substrate. Then a plurality of connecting members are formed, and the plurality of internal circuits of the semiconductor chip to the plurality of connectors of the insulating substrate by the plurality connecting members. A radiating pad is disposed on the second opposite surface of the insulating substrate, and is electrically connected to at least two individual internal circuits of the plurality of internal circuits of the semiconductor chip by the plurality connecting members.

As described above, according to the semiconductor chip package and the printed circuit board assembly including the semiconductor chip package described in reference to exemplary embodiments of the present invention, a plurality of connecting leads o a semiconductor chip package can be symmetrically disposed. Accordingly, if the orientation of the semiconductor chip package is rotated due to an operator error when mounting the semiconductor chip package, the semiconductor chip functions normally and is not damaged.

Although the present invention has been described in connection with exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects, and are intended to cover various modifications and equivalent arrangements of the present invention as described in the following claims.

What is claimed is:

1. A semiconductor chip package comprising:
   an insulating substrate comprising a first surface, an opposite second surface, a first side and an opposite second side;
   a plurality of connectors symmetrically disposed on the respective first and second sides of the insulating substrate;
   a semiconductor chip disposed on the first surface of the insulating substrate, the semiconductor chip comprising first and second internal circuits substantially equivalent to each other and electrically connected to at least two connectors of the plurality of connectors; and
   a radiating pad disposed on the second surface of the insulating substrate and is electrically connected to the first and second internal circuits
   wherein, the at least two connectors of the plurality of connectors being symmetrically diagonally disposed with respect to a geometric center of the insulating substrate, and
   wherein, the first and second internal circuits are symmetrically and diagonally disposed in the semiconductor chip.

2. The semiconductor chip package of claim 1, wherein the plurality of connectors comprises a plurality of input/output connecting leads and a plurality of power connecting leads.

3. The semiconductor chip package of claim 2, wherein two power connecting leads of the plurality of power connecting leads are aligned with the geometric center and disposed on the respective first and second sides of the insulating substrate.

4. The semiconductor chip package of claim 2, wherein at least two power connecting leads of the plurality of power connecting leads are supplied with voltages of substantially the same magnitude.

5. The semiconductor chip package of claim 1, further comprising at least one first via hole formed in the insulating substrate and a first conductive substance disposed within the at least one first via hole.

6. The semiconductor chip package of claim 5, wherein:
the radiating pad is electrically connected to the at least one first via hole by the first conductive substance disposed within the at least one first via hole; and
the at least one rust via hole is electrically connected to at least one internal circuit of the plurality of internal circuits of the semiconductor chip by an individual bonding wire of a plurality of bonding wires which is connected to the first conductive substance disposed within the at least one first via hole.

7. The semiconductor chip package of claim 5, wherein:
the radiating pad is electrically connected to the first conductive substance disposed within the at least one first via hole;
the at least one first via hole is electrically connected to at least one second via hole formed in the semiconductor chip, the at least one second via hole comprising a second conductive substance disposed within the at least one second via hole; and
the at least one second via hole is electrically connected to at least one internal circuit of the plurality of internal circuits of the semiconductor chip by the second conductive substance.

8. The semiconductor chip package of claim 2, further comprising
a plurality of substantially similar driving circuits which receive driving signals from an outside circuit via the plurality of input/output connecting leads; and
at least two first power circuits connected to the plurality of power connecting leads and which transmit a first power voltage from an outside circuit to the plurality of substantially similar driving circuits,
wherein at least two first power circuits are substantially equivalent circuits,
wherein the first and second internal circuits of the semiconductor chip comprises:
two second power circuits connected to the radiating pad and which transmit a second power voltage from an outside circuit to the plurality of substantially similar driving circuits.

9. The semiconductor chip package of claim 8, wherein the plurality of substantially similar driving circuits comprises at least one of an operational amplifier, a buffer and an inverter.

10. The semiconductor chip package of claim 8, wherein the second power voltage is an earth ground voltage.

11. The semiconductor chip package of claim 1, further comprising a plurality of connecting members which electrically connect the first and second internal circuits of the semiconductor chip to at least two connectors of the plurality of connectors.

12. A semiconductor chip package comprising:
an insulating substrate comprising a first surface, an opposite second surface, a first side and an opposite second side;
a plurality of connectors symmetrically disposed on the respective first and second sides of the insulating substrate;
a semiconductor chip disposed on the first surface of the insulating substrate, the semiconductor chip comprising a first and second internal circuits substantially equivalent to each other and electrically connected to at least two connectors of the plurality of connectors; and
a radiating pad disposed on the second surface of the insulating substrate and is electrically connected to the first and second internal circuits
wherein the at least two connectors of the plurality of connectors being symmetrically disposed with respect to a geometric center of the insulating substrate along a line, and
wherein the first and second internal circuits are symmetrically and diagonally disposed in the semiconductor chip.

13. The semiconductor chip package of claim 12, further comprising a plurality of connecting members which electrically connect the first and second internal circuits of the semiconductor chip to at least two connectors of the plurality of connectors.

14. The semiconductor chip package of claim 12, further comprising at least one first via hole formed in the insulating substrate and a first conductive substance disposed within the at least one first via hole.

15. The semiconductor chip package of claim 11, wherein the plurality of connecting members comprises a plurality of bonding wires.

* * * * *